United States Patent
Chen et al.

(10) Patent No.: US 11,219,142 B2
(45) Date of Patent: Jan. 4, 2022

(54) LIQUID DRAIN MECHANISM FOR IMMERSION COOLING SYSTEM

(71) Applicant: Quanta Computer Inc., Taoyuan (TW)

(72) Inventors: Chao-Jung Chen, Taoyuan (TW); Yu-Nien Huang, Taoyuan (TW); Yung-Hsiang Lu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 20 days.

(21) Appl. No.: 16/856,804

(22) Filed: Apr. 23, 2020

(65) Prior Publication Data
US 2021/0274687 A1 Sep. 2, 2021

Related U.S. Application Data

(60) Provisional application No. 62/982,533, filed on Feb. 27, 2020.

(51) Int. Cl.
*H05K 7/20* (2006.01)

(52) U.S. Cl.
CPC ..... *H05K 7/20781* (2013.01); *H05K 7/20236* (2013.01); *H05K 7/20272* (2013.01)

(58) Field of Classification Search
None
See application file for complete search history.

(56) References Cited

U.S. PATENT DOCUMENTS

| | | | | |
|---|---|---|---|---|
| 7,385,810 B2* | 6/2008 | Chu | ..................... | H05K 7/2079 165/104.33 |
| 8,113,009 B2* | 2/2012 | Kuriyama | .......... | H05K 7/20745 62/259.2 |
| 8,144,467 B2* | 3/2012 | Campbell | .......... | H05K 7/20736 361/699 |
| 8,964,391 B2* | 2/2015 | Campbell | .......... | H05K 7/20809 361/700 |
| 9,250,024 B2* | 2/2016 | Campbell | ............... | F28D 15/02 |
| 9,313,920 B2* | 4/2016 | Campbell | ................. | F28B 3/04 |
| 2004/0008483 A1* | 1/2004 | Cheon | ........................ | G06F 1/20 361/679.53 |
| 2011/0026225 A1* | 2/2011 | Ostwald | ............. | H05K 7/20781 361/699 |
| 2011/0315353 A1* | 12/2011 | Campbell | .......... | H05K 7/20809 165/104.31 |
| 2013/0271918 A1* | 10/2013 | Neville Hughes | .......................... | H05K 7/20309 361/702 |
| 2016/0353613 A1* | 12/2016 | Chen | .................. | H05K 7/20781 |

(Continued)

*Primary Examiner* — Courtney L Smith
(74) *Attorney, Agent, or Firm* — Nixon Peabody LLP

(57) ABSTRACT

An equipment assembly that allows easier replacement of heat-generating electrical components is disclosed. The assembly includes a rack for containing a heat-generating electrical component. The component includes a coolant inlet, a coolant outlet, and a drain connector. A cold manifold supplies coolant to the heat-generating electrical component through the coolant inlet. A hot manifold collects coolant from the heat-generating electrical component through the coolant outlet. A drain manifold includes a coupler. The coolant inlet and the coolant outlet are disconnected from the cold and hot manifolds. The drain connector is fluidly connected to the drain manifold to drain coolant from the heat-generating electrical component before the heat-generating electrical component is removed from the rack.

17 Claims, 5 Drawing Sheets

(56) References Cited

U.S. PATENT DOCUMENTS

2017/0064862 A1\* 3/2017 Miyoshi ............ H01L 21/67109
2020/0248913 A1\* 8/2020 Al-Amri ............... F24F 5/0042

\* cited by examiner

LIQUID DRAIN MECHANISM FOR IMMERSION COOLING SYSTEM

PRIORITY CLAIM

The present disclosure claims priority to U.S. Provisional Application Ser. No. 62/982,566, filed Feb. 27, 2020. The contents of that application in its entirety are hereby incorporated by reference.

TECHNICAL FIELD

The present disclosure relates generally to a cooling system for a computer system. More particularly, aspects of this disclosure relate to an immersion cooling system having a draining mechanism to facilitate service of a coolant distribution unit.

BACKGROUND

Electronic components, such as servers, include numerous electronic components that are powered by a common power supply. Servers generate an enormous amount of heat due to the operation of internal electronic devices such as controllers, processors, and memory. Overheating from the inefficient removal of such heat has the potential to shut down or impede the operation of such devices. Thus, current servers are designed to rely on air flow through the interior of the server to carry away heat generated from electronic components. Servers often include various heat sinks that are attached to the electronic components such as processing units. Heat sinks absorb the heat from the electronic components, thus transferring the heat away from the components. The heat from heat sinks must be vented away from the server. Air flow to vent away such heat is often generated by a fan system.

Due to the improvement of high-performance systems, the amount of heat that needs to be removed becomes higher with each new generation of electronic components. With the advent of more powerful components, traditional air cooling in combination with fan systems is inadequate to sufficiently remove heat generated by newer generation components. The development of liquid cooling has been spurred by the need for increased cooling. Liquid cooling is the currently accepted solution for rapid heat removal due to the superior thermal performance from liquid cooling. At room temperature, the heat transfer coefficient of air is only 0.024 W/mK while a coolant, such as water, has a heat transfer coefficient of 0.58 W/mK, which is 24 times than that of air. Thus, liquid cooling is more effective in transporting heat away from a heat source to a radiator, and allows heat removal from critical parts without noise pollution.

A well-known liquid cooling system is an immersion type system. In this system, the computing devices in a rack such as servers, switches, and storage devices will be immersed in a tank holding coolant. The chassis of such a system is not sealed, and the coolant liquid can circulate between and through the components to carry away generated heat. However, such a system makes maintenance and replacement of components cumbersome, as the components must be pulled out from the top of the tank. Further, the components can be only be placed side by side in the immersion tank, and thus such a system suffers from low power density.

Another type of immersion system eliminates the need for a tank. Such a system includes a fully sealed chassis with one inlet connector and one outlet connector connected to manifolds that supply coolant to the components. FIG. 1A shows a prior art example of a tankless immersion system 10. The system 10 includes a rack 12, a series of heat-generating components 14, and a coolant distribution unit (CDU) 16. FIG. 1B is a close-up view of the coolant distribution unit 16. As may be seen in FIGS. 1A-1B, the rack 12 includes a bottom frame 20. The bottom frame 20 has wheels 22 that allow the rack 12 to be moved to desired locations in a data center. The bottom frame 20 supports vertical posts 24a, 24b, 24c, and 24d. A top panel 26 connects the tops of the vertical posts 24a, 24b, 24c, and 24d. Each of the vertical posts 24a, 24b, 24c, and 24d may include holes to allow pins to be inserted to support shelves supported by the posts 24a, 24b, 24c, and 24d.

The coolant distribution unit 16 is mounted on the bottom frame 20, under all of the heat generating components 14. Each of the shelves supported by the posts 24a, 24b, 24c, and 24d may thus support one or more of the heat-generating components 14. In this example the heat-generating components 14 may include storage servers, application servers, switches or other devices. In this example, the placement of the components 14 in the rack 12 are in a horizontal orientation, but the rack may support the vertical orientation of components.

The rack 12 supports a cold manifold 30 and a hot manifold 32 that span between the bottom frame 20 and the top panel 26 of the rack 12. The cold manifold 30 is fluidly connected to the coolant distribution unit 16 via a cold coolant pipe 34 near the bottom of the rack 12. The hot manifold 32 is fluidly connected to the coolant distribution unit 16 via a hot coolant pipe 36 near the bottom of the rack 12. Each of the components 14 includes coolant connectors 40 and 42 that may be connected to couplers that are spaced along the length of both the cold manifold 30 and the hot manifold 32. The components 14 may include an internal network of fluid conduits that circulate coolant throughout the internal elements of the components 14. For example, one component 14 may be an application server that has internal cold plates in contact with processing devices within the chassis of the server. Coolant is provided by the cold manifold 30 through the connector 40 and circulated through the cold plates to carry away heat generated by the processing devices. The coolant is returned through the connector 42 through the hot manifold 32.

Thus, the coolant liquid will flow into the components 14 from the coolant pipe 34 and cold manifold 30. The coolant will circulate through internal components to absorb heat, and flow out of the components 14 through the hot manifold 32 to the coolant pipe 36. The heated coolant will be sent through coolant distribution unit 16. The coolant distribution unit 16 includes an internal heat exchanger and a pump. The heat exchanger removes the heat from the heated coolant flowing from the hot coolant pipe 36, and the pump recirculates the now cooled coolant back through the cold coolant pipe 34. The heat exchanger may include a series of internal fins that may be cooled by a fan unit. In this example, the heat exchanger is integrated in the coolant distribution unit 16. Alternatively, a door may be attached to the rack 12, and the heat exchanger and fan unit may be mounted on the door.

Unlike the tank system, each component 14 is placed in a more efficient stacked arrangement resulting in a higher power density. When one of the components 14 needs to be serviced, a technician may disconnect the respective coolant connectors 40 and 42 from the cold manifold 30 and the hot manifold 32. The technician may then seal the connectors 40 and 42 on the component 14 to prevent coolant from leaking.

The technician may then pull the component 14 out from the rack 12. However, the sealed chassis of the component 14 is full of liquid coolant. Thus, the component 14 is very heavy and impedes the ability of a technician to service the unit. For example, a server with coolant may weigh 26 kg (58 pounds), but the same server without any coolant may weigh approximately 14 kg (30 pounds).

Thus, there is a need to provide a method to drain coolant from a computing device component on a rack before it is removed for service. There is a further need for a separate conduit that may be connected to drain coolant from a rack component before the component is serviced.

SUMMARY

One disclosed example is an equipment assembly including a rack for containing a heat-generating electrical component. The component includes a coolant inlet, a coolant outlet, and a draining connector. A cold manifold supplies coolant to the heat-generating electrical component through the coolant inlet. A hot manifold collects coolant from the heat-generating electrical component through the coolant outlet. A drain manifold includes a coupler. The coolant inlet and the coolant outlet are disconnected from the cold and hot manifolds. The draining connector is fluidly connected to the drain manifold to drain coolant from the heat-generating electrical component before the heat-generating electrical component is removed from the rack.

In another disclosed implementation of the example equipment assembly, the assembly includes a coolant distribution unit fluidly coupled to the hot manifold and the cold manifold. The coolant distribution unit includes a heat exchanger, a pump, a cold coolant pipe fluidly connected to the cold manifold, and a hot coolant pipe fluidly connected to the hot manifold. In another disclosed implementation, the coolant distribution unit is located at the bottom of the rack, under the heat-generating electrical component. In another disclosed implementation, the equipment assembly includes a reservoir having a fluid conduit in fluid communication to the drain manifold. In another disclosed implementation, the assembly includes a door on the rack. A cooling system in fluid communication with the cold and hot manifolds is mounted on the door. In another disclosed implementation, the heat-generating component includes a sealed chassis holding internal elements and internal conduits coupled to the coolant inlet and coolant outlet to circulate coolant around the internal elements. In another disclosed implementation, the heat-generating component is one of a storage server, application server, or switch device.

Another disclosed example is a method of draining coolant from a heat-generating component in a rack. The rack includes a cold manifold, a hot manifold, and a drain manifold. The heat-generating component includes a coolant inlet in fluid communication with the cold manifold, a coolant outlet in communication with the hot manifold, and a draining connector. The coolant inlet is disconnected from the cold manifold. The coolant outlet is disconnected from the hot manifold. The draining connector is connected to the drain manifold to allow coolant in the heat-generating component to drain into the drain manifold. The heat-generating component is removed from the rack after the coolant is drained.

In another disclosed implementation of the example method, the assembly includes a coolant distribution unit fluidly coupled to the hot manifold and the cold manifold. The coolant distribution unit includes a heat exchanger, a pump, a cold coolant pipe fluidly connected to the cold manifold, and a hot coolant pipe fluidly connected to the hot manifold. In another disclosed implementation, the coolant distribution unit is located at the bottom of the rack, under the heat-generating electrical component. In another disclosed implementation, the equipment assembly includes a reservoir having a fluid conduit in fluid communication to the drain manifold. In another disclosed implementation, the assembly includes a door on the rack. A cooling system in fluid communication with the cold and hot manifolds is mounted on the door. In another disclosed implementation, the heat-generating component includes a sealed chassis holding internal elements and internal conduits coupled to the coolant inlet and coolant outlet to circulate coolant around the internal elements. In another disclosed implementation, the heat-generating component is one of a storage server, application server, or switch device.

Another disclosed example is an electronic heat-generating device for insertion in a rack having a cold manifold and a hot manifold. The device includes a sealed chassis having at least one heat-generating electronic heat-generating device element. The device includes a coolant inlet fluidly connectable to the cold manifold. The device includes a coolant outlet fluidly connectable to the hot manifold. The device includes internal conduits for circulating coolant around the heat-generating element in the sealed chassis. The device includes a draining connector to drain liquid coolant from the internal conduit when electronic heat-generating device is removed from the rack.

In another disclosed implementation of the example device, the element is one of a processor or a memory device. In another disclosed implementation, the device is one of a storage server, application server, or switch device.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
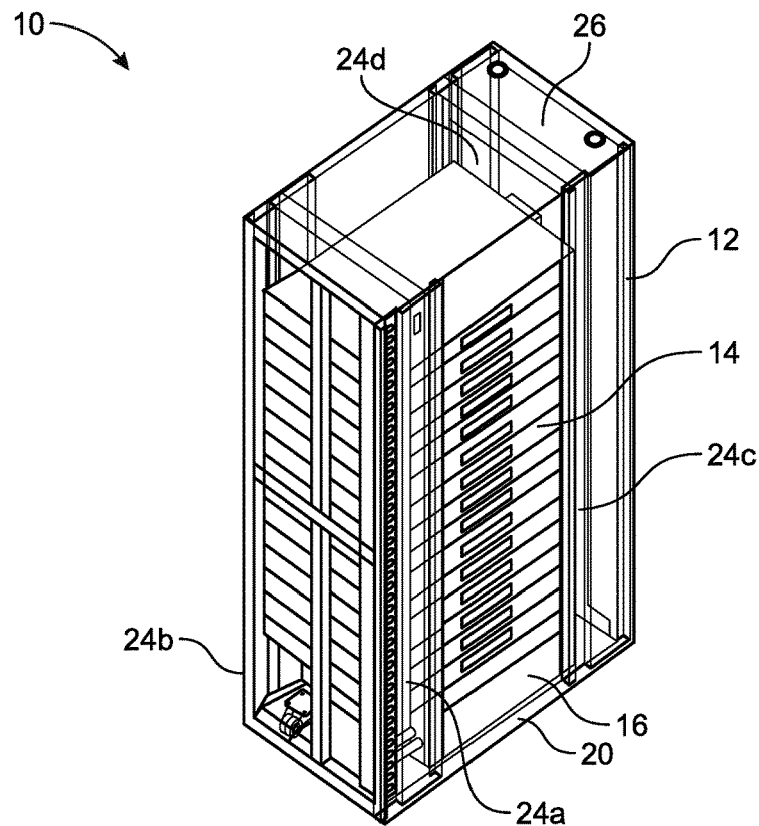
FIG. 1A is a perspective view of a known prior art immersion cooling system on a rack housing.
Figure 1B:
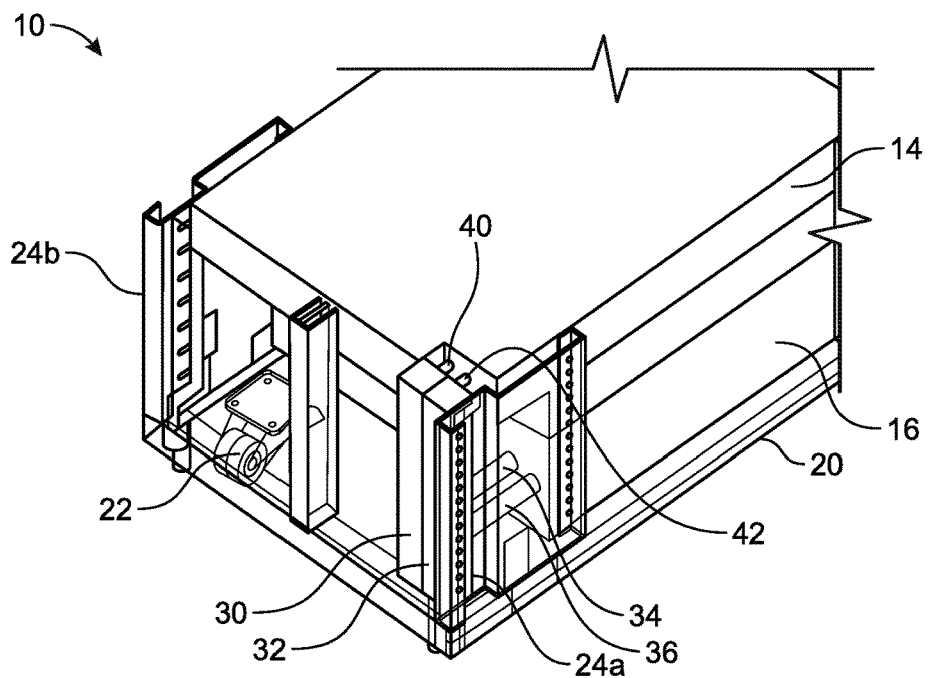
FIG. 1B is a close-up view of the prior art rack housing with the coolant distribution unit in FIG. 1A.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to an immersion cooling system on a rack with a liquid drain mechanism in a sealed chassis to allow draining of coolant from the sealed chassis. The drain mechanism includes an additional draining connector in a fully sealed chassis of each of a number of heat-generating components supported by the rack. The draining connector is connected to an additional drain manifold and reservoir on the rack to store the drained liquid coolant during service of the component. The liquid coolant can be drained from the draining connector when the component needs to be serviced. Thus, the component will be free of coolant and therefore have a lighter weight for removal from the rack. After service or replacement of the component, the reservoir can provide the stored coolant to the coolant distribution unit, so the drained liquid coolant can be recycled for the replaced component.

Figure 2A:
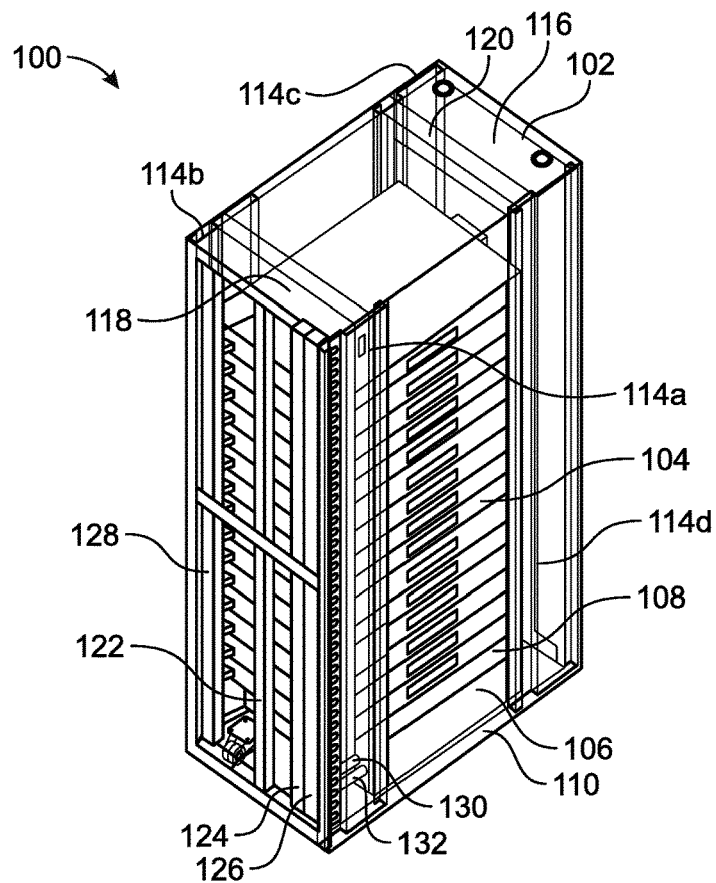
FIG. 2A is a perspective view of an example rack based liquid immersion system with a drain mechanism, according to certain aspects of the present disclosure.
Figure 2B:
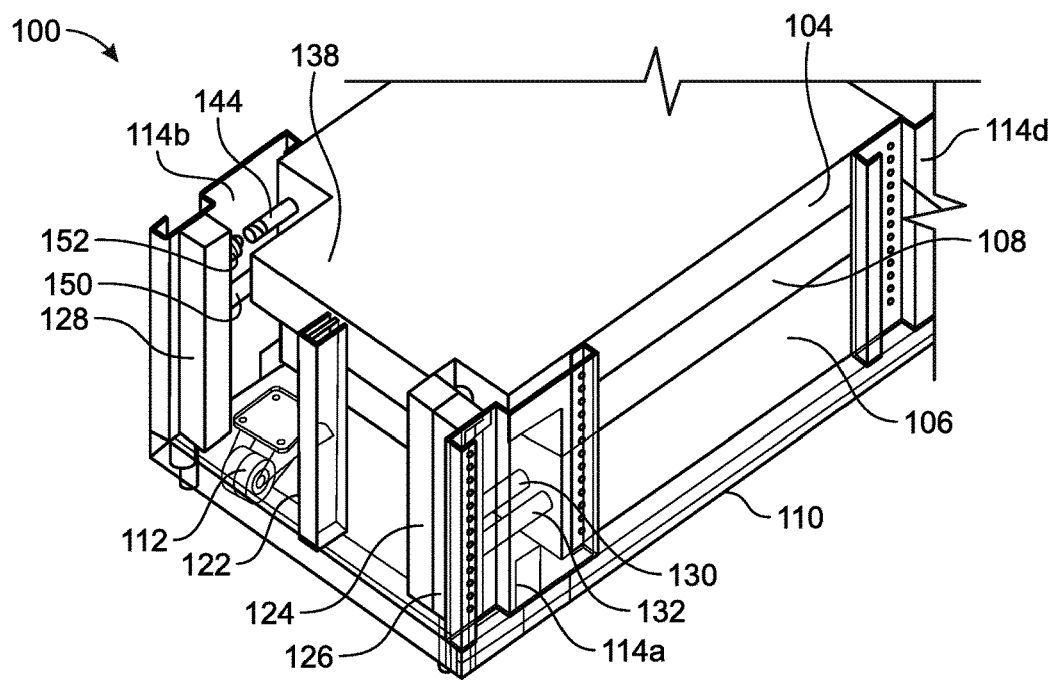
FIG. 2B is a close-up top perspective view of one example of the liquid immersion system with the drain mechanism in FIG. 2A, according to certain aspects of the present disclosure.
Figure 2C:
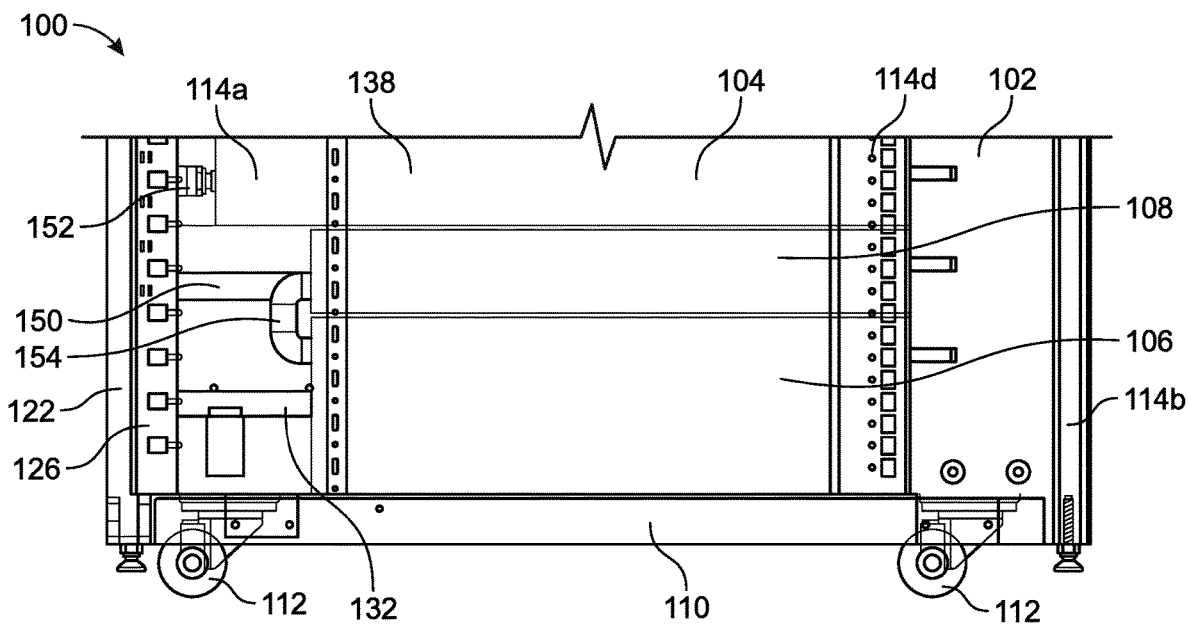
FIG. 2C is a side view of the example rack based liquid immersion system with a drain mechanism in FIG. 2A, according to certain aspects of the present disclosure.
Figure 2D:
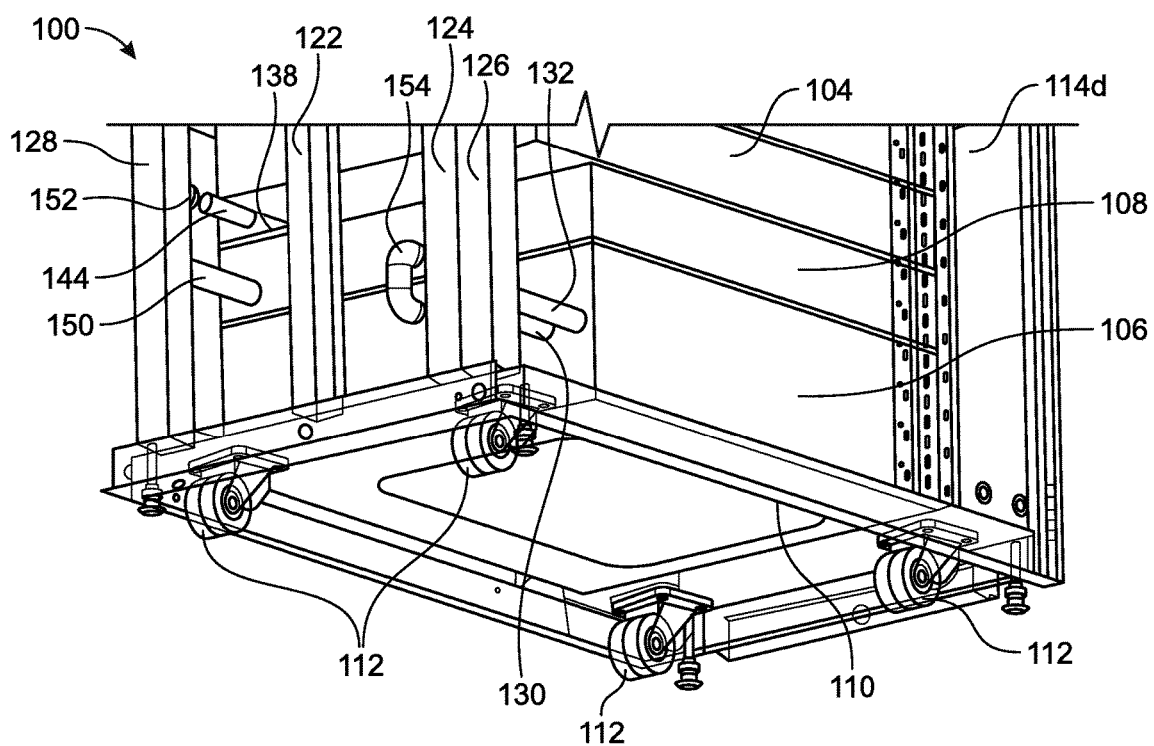
FIG. 2D is a close-up bottom perspective view of one example of the liquid immersion system with the drain mechanism in FIG. 2A, according to certain aspects of the present disclosure.

FIG. 2A shows an example fully sealed chassis immersion cooling system 100 that includes a rack 102, a series of heat-generating components 104, a coolant distribution unit (CDU) 106, and a reservoir 108. FIG. 2B is a close-up top perspective view of the coolant distribution unit 106 and reservoir 108. FIG. 2C is a side view of the example closed chassis immersion system 100. FIG. 2D is a close-up bottom perspective view of the coolant distribution unit 106 and reservoir 108. Like elements in FIGS. 2A-2D are labeled with identical reference numbers. As may be seen in FIGS. 2A-2D, the heat-generating components 104 are stacked over the reservoir 108 and the coolant distribution unit 106 in the rack 102. Each of the heat-generating components 104 have a fully sealed chassis to allow circulation of coolant to cool internal elements in the chassis.

As shown in FIGS. 2A-2D, the rack 102 includes a rectangular bottom frame 110. The bottom frame 110 includes a set of wheels 112 attached to the bottom of the frame 110. The wheels 112 allow the rack 102 to be moved to desired locations in a data center. Side members of the bottom frame 110 support vertical supports 114a, 114b, 114c, and 114d. A top panel 116 connects the tops of the vertical supports 114a, 114b, 114c, and 114d. The top panel 116 holds lateral bracing members 118 and 120 that connect the tops of the vertical supports 114a and 114b, and 114c and 114d respectively. Each of the vertical supports 114a, 114b, 114c, and 114d may include holes to allow pins to be inserted to support shelves that may be installed between the supports 114a, 114b, 114c, and 114d. The supports 114a and 114b define the rear end of the rack 102. A vertical bus bar 122 extends from the rear of the top panel 116 to the frame 110. The bus bar 122 may supply power to the components 104. The bus bar 122 may also support cables that may be connected to the components 104. The front end of the rack 102 is defined by the supports 114c and 114d. The components 104 are generally installed from the front end of the rack 102 between the supports 114c and 114d on one of the shelves. The components 104 thus may be pushed into the rack 102 until they contact the bus bar 122. The individual components 104 may also be pulled out of the rack 102 from the rear of the rack 102, between the supports 114c and 114d, for replacement or service.

The coolant distribution unit 106 is mounted on the bottom frame 110, under all the stack of heat-generating components 104, in this example. In this example the heat-generating components 104 may be storage servers, application servers, switches, or other electronic devices. Each of the shelves between the supports 114a-114d may hold one or more of the heat-generating components 104. The shelves may be arranged to have different heights between the shelves. It is understood that any number of shelves and corresponding heat-generating components 104 may be installed in the rack 102. In this example, the placement of the components 104 in the rack 102 is in a horizontal orientation. However, with additional internal structures connected to the supports 114a, 114b, 114c, and 114d, the heat-generating components 104 could be in a vertical orientation.

The rack 102 supports a cold manifold 124, a hot manifold 126, and a drain manifold 128 that each extend over the height of the rack 102 at the rear of the rack 102 between the supports 114a and 114b. The cold manifold 124 is fluidly connected to the coolant distribution unit 106 via a cold coolant pipe 130. The hot manifold 126 is fluidly connected to the coolant distribution unit 106 via a hot coolant pipe 132. Each of the manifolds 124 and 126 can allow coolant to circulate along the respective length of the manifold. At periodic intervals, the manifolds 124 and 126 have respective fluid couplers that allow fluid communication to one of the components 104.

Each of the components 104 includes a fully sealed chassis 138 that encloses the electronics of the component 104. In this example, the rear of the chassis 138 of each of the components 104 includes an inlet connector 140 that may be connected to one of the fluid couplers of the cold manifold 124. The rear of the chassis 138 also includes an outlet connector 142 that may be connected to one of the fluid couplers of the hot manifold 126. The rear of the chassis 138 of each of the components 104 also include a draining connector 144. The draining connector 144 is connected to the chassis 138 on a rear area that is recessed from the rest of the rear of the chassis 138. Thus, in this example, the draining connector 144 is a tube that may be extended out for connection to the drain manifold 128 to drain coolant. During normal operation, the draining connector 144 is not connected to the drain manifold 128 and may be compressed in the recess of the chassis 138.

The fully sealed chassis 138 encloses electronic components, power supplies, circuit boards, device cards, processors, memory devices, and other elements. The chassis 138 may include an internal network of fluid conduits that circulate coolant around the internal elements of the components 104. The coolant is fully sealed by the chassis 138 and can only enter or exit the chassis 138 via the inlet connector 140, the outlet connector 142 or the draining connector 144.

For example, one of the components 104 may be an application server having processing devices such as CPUs and GPUs. The application server may include cold plates in contact with the CPUs and GPUs, as well as adjacent memory devices such as DIMMs. Coolant is circulated through the cold plates to carry away heat generated by the processing devices and memory devices. In this example, the individual heat-generating components 104 may be inserted on a shelf from the front of the rack 102. Once in place, the inlet connector 140 is fluidly connected with one of the couplers of the cold manifold 124, and the outlet connector 142 is fluidly connected with one of the couplers of the hot manifold 126. The component 104 may be connected to a power supply and other cables such as those supported by the bus bar 122.

The manifolds 124 and 126 circulate coolant to the component 104 through a closed loop formed with the coolant distribution unit 106. Thus, the coolant liquid will flow into each of the components 104 from the inlet connector 140 from the cold manifold 124. The coolant will circulate through the internal conduits of the component 104 to absorb heat from the internal elements, and flow out of the component 104 through the outlet connector 142 to the hot manifold 126. The heated coolant will be circulated to the coolant distribution unit 106 from the outlet pipe 132. The coolant distribution unit 106 includes an internal heat exchanger and a pump installed internally in the chassis. The heat exchanger removes the heat from the heated coolant, and the pump recirculates the now cooled coolant back through the inlet pipe 130 to the cold manifold 124. Typically, the heat exchanger dissipates the collected heat through an open loop cooling system, such as a fan system. In this example, the heat exchanger and pump are an integrated unit. However, a rear door may be attached to the rear of the rack 102. The rear door may support the heat exchanger and an open loop cooling system such as a fan wall.

The draining mechanism consisting of the reservoir 108, and the drain manifold 128 allows coolant to be drained from any of the components 104 before the components 104 are removed from the rack 102. The drain manifold 128 runs the length of the rack 102 between the frame 110 and the top panel 116. The drain manifold 128 is fluidly connected to the reservoir 108 via a connection pipe 150. The drain manifold 128 includes couplers 152 that are spaced in vertical alignment with each of the components 104. The couplers 152 may be connected to the drain connector 144 of the component 104. A connection pipe 154 fluidly connects the reservoir 108 to the coolant distribution unit 106. In this manner, collected coolant in the reservoir 108 may be supplied to the coolant distribution unit 106.

Figure 3A:
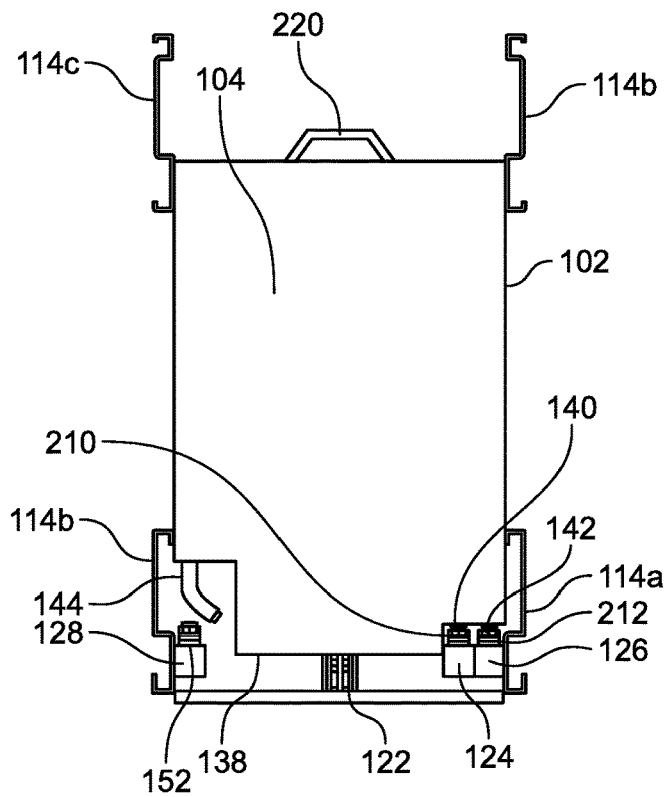
FIG. 3A is a top cutaway view of an example heat-generating component in operational position with the drain mechanism disconnected, according to certain aspects of the present disclosure.
Figure 3B:
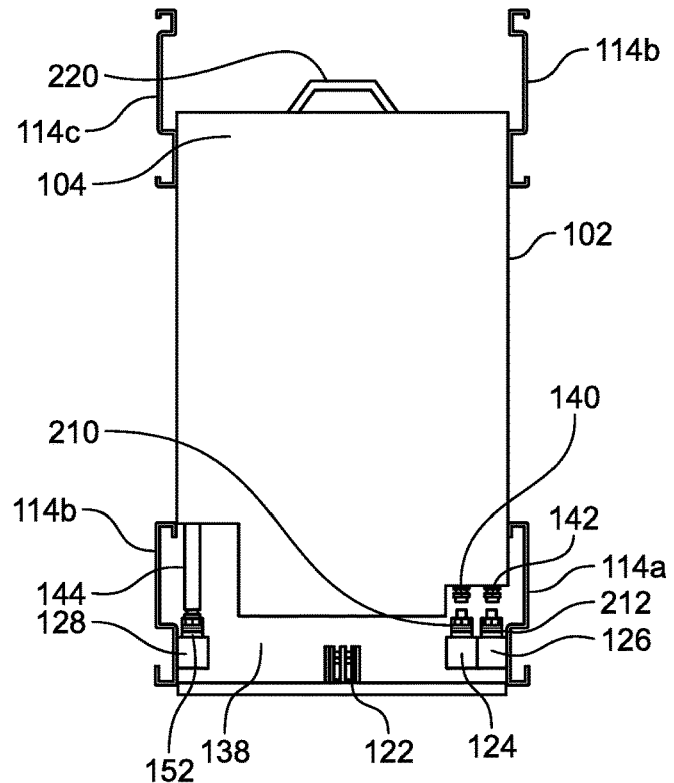
FIG. 3B is a top cutaway view of the example heat-generating component in FIG. 3A in a position relative to the rack to allow draining of the coolant, according to certain aspects of the present disclosure.
Figure 3C:
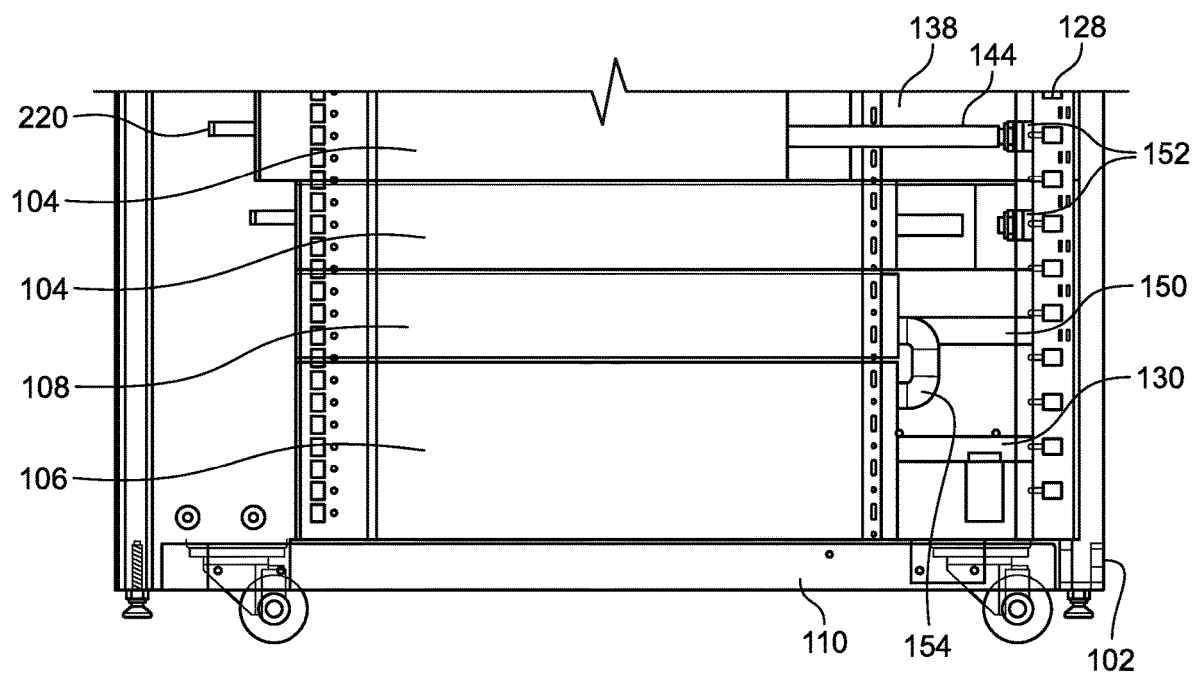
FIG. 3C is a side view of the example heat-generating component in FIG. 3A in a position relative to the rack to allow draining of the coolant to the reservoir.
Figure 3D:
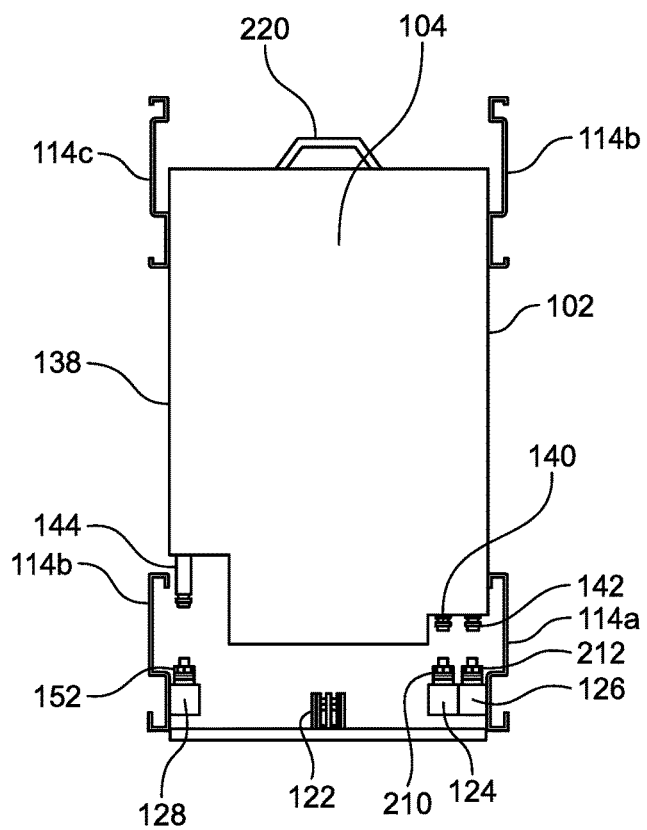
FIG. 3D is a top cutaway view of the example heat-generating component in FIG. 3A that is removed from the rack after the coolant has been drained.

The reservoir 108 may store liquid coolant that may be drained from any of the components 104 that are removed from the rack 102. FIGS. 3A, 3B, and 3D are a top views of the one of the components 104 in the rack 102 during a removal and draining process. FIG. 3C is a side view of one of the components 104 in the removal process. Like elements in FIGS. 2A-2D are labeled with identical reference numbers in FIGS. 3A-3D. In a normal operational state of the component 104, the draining connector 144 of the component 104 is not connected to the drain manifold 128 as shown in FIG. 3A. The draining connector 144 is generally plugged to prevent the coolant from leaking out of the chassis 138. The inlet connector 140 and the outlet connector 142 are connected to couplers 210 and 212 of the respective cold manifold 124 and the hot manifold 126 to allow circulation of the coolant to the component 104.

When the component 104 needs to be serviced, the chassis 138 is partially pulled out from the front of the rack 102, as shown in FIGS. 3B and 3C. In this example, the front end of the chassis 138 may include a handle 220 to assist in pulling out the component 104. The inlet and outlet connectors 140 and 142 are disconnected from the couplers 210 and 212 of the manifolds 124 and 126. A technician may then pull the component 104 partially out from the front of the rack 102. The inlet connector 140 and the outlet connector 142 are plugged to prevent coolant from leaking from the component 104. As shown in FIGS. 3B-3C, the chassis 138 is pulled out to a distance where the draining connector 144 may be connected to the coupler 152 of the drain manifold 128, and where there is sufficient distance separating the connectors 140 and 142 from the couplers 210 and 212. When the chassis 138 is in this position, the draining connector 144 is unplugged and connected to the coupler 152 of the drain manifold 128. All coolant in the chassis 138 will thus be drained through the draining connector 144 into the drain manifold 128. The drained coolant will flow from the drain manifold 128 through the connection pipe 150 to the reservoir 108 for storage.

As shown in FIG. 3D, after all of the coolant is drained from the chassis 138, the draining connector 144 may be disconnected from the manifold 128. The coupler 152 of the drain manifold 128 may be plugged to prevent coolant leaks. The component 104 drained of coolant may then be entirely pulled out of the rack 102 for service or replacement. The removal of the coolant makes the component 104 lighter for easier handling.

When a new component or the repaired component 104 is inserted back into the rack 102, the connectors 140 and 142 will be connected to the couplers of the cold manifold 124 and the hot manifold 126. The connected component 104 will then be filled with liquid coolant from the inlet connector 140 from the cold manifold 124. After the new or replaced component 104 is filled with liquid coolant, the component 104 may be powered-on.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including,"

"includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An equipment assembly, comprising:
    a rack for containing a heat-generating electrical component, the component including a coolant inlet, a coolant outlet, and a draining connector, wherein the draining connector is distinct from the coolant inlet and the coolant outlet;
    a cold manifold to supply coolant to the heat-generating electrical component through the coolant inlet;
    a hot manifold to collect coolant from the heat-generating electrical component through the coolant outlet; and
    a drain manifold including a coupler, wherein the drain manifold is distinct from the cold manifold and the hot manifold, and wherein when the coolant inlet and the coolant outlet are disconnected from the cold and hot manifolds the draining connector is directly fluidly connectable to the drain manifold to drain coolant from the heat-generating electrical component before the heat-generating electrical component is removed from the rack.

2. The equipment assembly of claim 1, further comprising a coolant distribution unit fluidly coupled to the hot manifold and the cold manifold, the coolant distribution unit including a heat exchanger, a pump, a cold coolant pipe fluidly connected to the cold manifold, and a hot coolant pipe fluidly connected to the hot manifold.

3. The equipment assembly of claim 2, wherein the coolant distribution unit is located at the bottom of the rack, under the heat-generating electrical component.

4. The equipment assembly of claim 1, further comprising a reservoir having a fluid conduit in fluid communication to the drain manifold.

5. The equipment assembly of claim 1, further comprising a door on the rack, wherein a cooling system in fluid communication with the cold and hot manifolds is mounted on the door.

6. The equipment assembly of claim 1, wherein the heat-generating component includes a sealed chassis holding internal elements and internal conduits coupled to the coolant inlet and coolant outlet to circulate coolant around the internal elements.

7. The equipment assembly of claim 1, wherein the heat-generating component is one of a storage server, application server, or switch device.

8. A method of draining coolant from a heat-generating component in a rack including a cold manifold, a hot manifold, and a drain manifold, the drain manifold distinct from the cold and hot manifolds, the heat-generating component including a coolant inlet in fluid communication with the cold manifold, a coolant outlet in communication with the hot manifold, and a draining connector, the draining connector distinct from the coolant inlet and the coolant outlet, the method comprising:
    disconnecting the coolant inlet from the cold manifold;
    disconnecting the coolant outlet from the hot manifold;
    directly connecting the draining connector to the drain manifold to allow coolant in the heat-generating component to drain into the drain manifold; and
    removing the heat-generating component from the rack after the coolant is drained.

9. The method of claim 8, wherein the rack includes a coolant distribution unit fluidly coupled to the hot manifold and the cold manifold, the coolant distribution unit including a heat exchanger, a pump, a cold coolant pipe fluidly connected to the cold manifold, and a hot coolant pipe fluidly connected to the hot manifold.

10. The method of claim 9, wherein the coolant distribution unit is located at the bottom of the rack, under the heat-generating electrical component.

11. The method of claim 8, wherein the rack includes a reservoir having a fluid conduit in fluid communication to the drain manifold.

12. The method of claim 8, wherein the rack includes a door, wherein a cooling system in fluid communication with the cold and hot manifolds is mounted on the door.

13. The method of claim 8, wherein the heat-generating component includes a sealed chassis holding internal elements and internal conduits coupled to the coolant inlet and coolant outlet to circulate coolant around the internal elements.

14. The method of claim 8, wherein the heat-generating component is one of a storage server, application server, or switch device.

15. An electronic heat-generating device for insertion in a rack having a cold manifold, a hot manifold, and a drain manifold, the device comprising:
    a sealed chassis having at least one heat-generating electronic heat-generating device element;
    a coolant inlet fluidly connectable to the cold manifold;
    a coolant outlet fluidly connectable to the hot manifold;
    internal conduits for circulating coolant around the heat-generating element in the sealed chassis;
    a draining connector to drain liquid coolant from the internal conduit prior to the electronic heat-generating device being removed from the rack, when the coolant inlet is fluidly disconnected from the cold manifold, and the coolant outlet is fluidly disconnected from the hot manifold, wherein the draining connector is distinct from the coolant inlet and the coolant outlet and directly connected to the drain manifold.

16. The electronic heat-generating device of claim 15, wherein the element is one of a processor or a memory device.

17. The electronic heat-generating device of claim 15, wherein the device is one of a storage server, application server, or switch device.

* * * * *